United States Patent [19]

Hubler et al.

[11] Patent Number: 5,015,353

[45] Date of Patent: May 14, 1991

[54] METHOD FOR PRODUCING SUBSTOICHIOMETRIC SILICON NITRIDE OF PRESELECTED PROPORTIONS

[75] Inventors: Graham K. Hubler, Alexandria; Edward P. Donovan, Annandale, both of Va.; Deborah Van Vechten, Baltimore, Md.

[73] Assignee: The United States of America as represented by the Secretary of the Navy, Washington, D.C.

[21] Appl. No.: 102,937

[22] Filed: Sep. 30, 1987

[51] Int. Cl.[5] ............................................. B05D 3/06
[52] U.S. Cl. ................................. 204/192.31; 427/38
[58] Field of Search .................... 204/192.12, 192.13, 204/192.15, 192.22, 192.23, 192.31; 219/15, 16; 427/35, 38, 294

[56] References Cited

U.S. PATENT DOCUMENTS

| | | | |
|---|---|---|---|
| 4,142,958 | 3/1979 | Wei et al. | 204/298 BD X |
| 4,262,056 | 4/1981 | Hubler et al. | 428/446 |
| 4,634,600 | 1/1987 | Shimizu et al. | 427/38 |
| 4,683,149 | 7/1987 | Suzuki et al. | 204/192.31 X |
| 4,759,934 | 7/1988 | Hashimoto et al. | 427/38 |

OTHER PUBLICATIONS

Cuomo et al., "Modification of Niobium . . . During Deposition", J. Vac. Sci. Technol., 20(3), 3/82, pp. 349–354.
C. Weissmantel, "Reactive Film Preparation," 32 Thin Solid Films 11 (1976).
H. J. Erler et al., "Nitride Film Deposition by Reactive Ion Beam Sputtering", 65 Thin Solid Films 233 (1980).
J. Ashley et al., "Interactions of Ion Beams with Surfaces Reactions of Nitrogen with Silicon and its Oxides", 68 J. Chem. Phys. 1776 (No. 4, Feb. 15, 1987).
G. K. Hubler et al., "Refractive Index Profiles and Range Distributions of Silicon Implanted with High–Energy Nitrogen," 50 J. Appl. Phys. 7147 (No. 11, Nov. 1979).
E. P. Donovan et al., "Infrared and Ion Beam Analysis of $Si_xN_{1-x}$ Alloys Grown by Ion Beam Assisted Deposition", 71 Materials Research Society Symposia Proceedings 487 (Materials Research Society, Oct. 1, 1986).

Primary Examiner—Nam X. Nguyen
Attorney, Agent, or Firm—Thomas E. McDonnell; Edward F. Miles

[57] ABSTRACT

An apparatus and method for producing films of silicon nitride whose index of refraction varies continuously with film depth by preselected amounts between n=3.9 and n=1.99. This is done by producing an amorphous film of silicon nitride, $Si_{1-x}N_x$, of pre-selected stoichiometry between x=0 and x=0.57. In a vacuum-chamber, a target substrate is exposed to vaporized silicon while being simultaneously bombarded with an ion beam of relatively high kinetic energy, ionized, nitrogen particles. The nitrogen embeds in the silicon film deposited on the substrate to form amorphous silicon nitride, the stoichiometry of which depends on the intensity of the ion beam. Instruments measure during the deposition the relative rate of arrival at the target for silicon and nitrogen, and, with pre-generated calibration data for the apparatus, enable an operator to selectively control the film's stoichiometry by controlling the ion beam's intensity response to the measured rate of silicon deposition.

13 Claims, 3 Drawing Sheets

METHOD FOR PRODUCING SUBSTOICHIOMETRIC SILICON NITRIDE OF PRESELECTED PROPORTIONS

BACKGROUND OF THE INVENTION

An important class of optical devices are those whose frequency response can be preselectively set by appropriate selection of the index of refraction profile with depth. Such devices include low pass, high pass and band pass filters, most notably among them RUGATE (holographic band rejection) filters. Heretofore such devices have been in the form of laminates, each individual layer of the laminate having a different index of refraction, these laminates being fabricated by physical vapor deposition, sputter deposition, or chemical vapor deposition techniques. Unfortunately, such laminates have several shortcomings which can be overcome only by fabricating the laminates using the extreme precautions of high substrate temperature, ultra high vacuum, and slow deposition rates. Absent these precautions, the laminates are inherently less dense than the bulk materials from which they are made, and thus have inherent porosity that facilitate infiltration by moisture or other chemical contaminants which can cause the laminates to degrade both structurally and optically over time. Because the interfaces among any laminate layers are of dissimilar materials, unless they have been carefully matched as to lattice constant and thermal expansion coefficient, there is necessarily great inherent stress at these interfaces, greatly reducing the structural soundness and durability of the laminates. Moreover, many optical devices whose fabrication is difficult if done in laminate form, could be readily constructed using a unitary material whose index of refraction could be preselectively and continuously varied as a function of the device's thickness (such as graded index antireflective coatings, and rugates).

In infrared and near infrared frequencies, both silicon (Si) and silicon nitride ($Si_3N_4$) have been used in abrasion resistant optical devices of the laminate kind discussed above. Silicon is useful only at frequencies corresponding to over one micrometer wavelength because of silicon's characteristic bandgap at 1.1 micrometers. Stoichiometric silicon nitride is also useful at these frequencies, as well as at somewhat higher frequencies (inclusive up to the blue portion of the visible spectrum), because of its larger bandgap. Substoichiometric combinations of silicon and nitrogen ($Si_{1-x}N_x$) have, as x varies from 0 (pure silicon) to 4/7 (stoichiometric silicon nitride), widely varying indicies of refraction in the infrared and near infrared of 3.9 to 1.9. Thus if one could accurately control as a function of specimen thickness, the relative proportions of silicon and nitrogen in silicon nitride alloy, one could produce a unitary specimen whose optical characteristics could heretofore be approximated only with laminates.

Silicon nitride is conventionally fabricated by flowing $SiH_4$ and $NH_3$ onto a heated substrate in a controlled vacuum (chemical vapor deposition). The heated substrate provides the energy necessary to break hydride bonds and form the bonds between silicon and nitrogen, the extremely low background pressure and high purity feedgasses excluding contaminants such as carbon and oxygen. By requiring the use of highly heated substrates, one severely limits the materials that can be used as substrates to those having exceptionally good refractory characteristics. By fabricating silicon nitride with hydrogen containing molecules, one virtually assures that hydrogen contaminants will be incorporated during the forming of a silicon nitride specimen, degrading its characteristics.

SUMMARY OF THE INVENTION

Accordingly, one object of this invention is to provide a method and apparatus for producing films of silicon nitride whose refractive index varies continuously with film depth by preselected amounts between n=3.9 and 1.99. This is achieved by varying the stoichiometry of the film.

Another object of the invention is to enable one to monitor the relative amount of nitrogen introduced into a silicon-nitrogen alloy film so as to reproducibly control the stoichiometry of the silicon nitrogen alloy film produced.

Another object of the invention is to enable one to deposit silicon-nitrogen alloy films at room temperature so as to enable one to use substrates that would otherwise degrade at high temperature.

Another object of the invention is to enable one to deposit silicon-nitrogen alloy films having low porosity and essentially bulk density.

Another object of the invention is to enable one to deposit silicon-nitrogen alloy films at lower pressures without introducing unacceptable levels of impurities, especially hydrogen.

Another object of the invention is to produce thicker, more structually sound, abrasion resistant optical devices of the graded index kind described above.

In accordance with these and other objects that shall become apparent hereinafter, there is provided a method and apparatus for forming silicon nitride alloy films of preselected stoichiometry. The apparatus is run in a vacuum chamber in which is disposed a target substrate exposed to a stream of silicon vapor. Also disposed in the chamber is an ion gun which ionizes a flow of nitrogen, and accelerates and forms the ions into an ion beam of relatively high energy directed at the target substrate. Disposed adjacent to the target and in the ion flux is one or more current monitors that infer the ion beam's intensity at the target. Disposed in the silicon vapor is a deposition monitor that infers the amount of silicon deposited on the target. The silicon vapor is allowed to condense on the target, upon which the vapor atoms adhere, and are deposited as a film on the substrate. Simultaneously, the nitrogen ions bombard and adhere to the target to form a silicon-nitrogen amorphous alloy, the stoichiometry of which varies with the intensity of the ion beam for a constant silicon deposition rate. By setting the intensity of the ion beam responsive to the current and deposition monitors, one can preselect the stoichiometry of the alloy, or preselectively vary stoichiometry with depth of film deposition. This is most advantageously done by a dedicated process computer. The high energy of the ion beam enables the overwhelming majority of nitrogen ions to embed in the target and form chemical bonds without the need to introduce energy into the target by external heating, enabling the process to the run, if desired, at room temperature or below. As nitrogen ions of the ion beam strike the target surface, the ions, in addition to adhering to the target silicon film, knock off more weakly bound impurities, such as hydrogen, oxygen or carbon. Because the ion beam in effect continually sputter cleans the target's surface, these impurities are incorporated to a lesser degree, and the process may be run at lower vacuum than would be otherwise possible for specimens of comparable purity. In addition, the ions initiate collision cascades of film atoms, in which knock-on atoms from the surface eliminate large voids, lowering the porosity and increasing the density to values approaching that of the bulk materials.

Films produced in this manner of simultaneous vapor and ion beam deposition, being composed only of silicon and nitrogen throughout, avoid the disadvantages of laminates, and, because of the preselectively variable stoichometry have preselectively variable indices of a refraction that vary as a function of depth, one can produce optical devices which heretofore could not be fabricated as unitary materials. Since the materials are hard, the coatings are abrasion resistant.

BRIEF DESCRIPTIONS OF THE DRAWINGS

A more complete appreciation of the invention and many of the attendant advantages thereof will be readily had as the same becomes better understood by reference to the following detailed description when considered in conjunction with the accompanying drawings wherein:

FIG. 2 shows the relationship between the amount of nitrogen actually incorporated in a sample, and the ratio between the amount of nitrogen and the amount of silicon arriving at the target sample.

FIG. 3 shows the relationship between the refractive index of the target sample, and fraction of nitrogen incorporated in the target sample.

DETAILED DESCRIPTION OF THE PREFERRED EMBODIMENT

Figure 1:
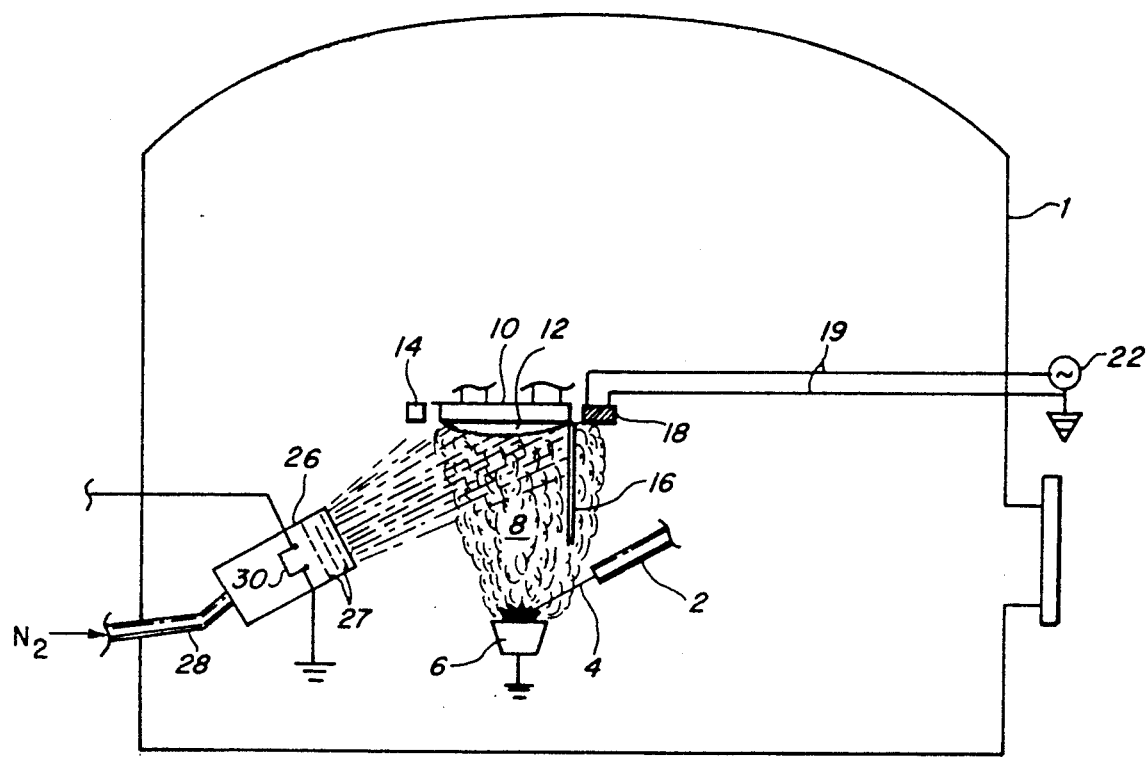
FIG. 1 is a side schematic view, in vertical cross-section, section, of the apparatus of the instant invention.

Referring now to the drawings, where like reference numerals designate identical or corresponding parts, and more particularly to FIG. 1 which shows a vacuum chamber 1 enclosing an apparatus by which the present invention may be practiced. Electron gun 2 is disposed to direct an electron beam 4 at silicon sample 6 effective to generate an stream of silicon vapor 8 within vacuum chamber 1. Target substrate 10 is disposed in chamber 1 so as to be exposed to vapor 8, whereby a film 12 of silicon may form upon substrate 10. Immediately adjacent substrate 10 is one or more Faraday cups 14. Also adjacent substrate 10 and exposed to vapor 8 is an evaporation rate monitor, such as a quartz crystal 18. Although any conventional deposition monitor can be used, in the preferred embodiment crystal 18 is connected to a pair of electrical leads 19 which impose a six $MH_z$ potential 22 across crystal 18, responsive to which crystal 18 vibrates, the magnitude of vibration depending on the characteristic frequency of crystal 18. As silicon vapor 8 deposits on crystal 18, the characteristic frequency changes, causing corresponding changes in the magnitude of vibration induced in crystal 18, and from which the amount of silicon deposited on crystal 18 (and hence on substrate 10) can be inferred. Also disposed within pressure chamber 1 is ion gun 26 having an anode and a cathode assembly 30, into which is fed a supply 28 of molecular nitrogen and one or more beam extractor grids 27. Shield 16 shields crystal 18 in a manner described below.

In operation, electron beam 4 boils off silicon atoms from silcon block 6 to generate vapor 8 in chamber 1, from which silicon is deposited both upon the substrate 10 and the sample 18. Because deposition of silicon on crystal 18 is used to infer the magnitude of silicon deposition on film 12, sample 18 must be placed sufficiently near to substrate 10 to ensure that the silicon vapor to which film 12 and crystal 18 are exposed has an empirically determinable constant ratio so as to calibrate the apparatus. (Other methods for determining silicon deposition rate are possible.) Simultaneously, nitrogen is fed into ion gun 26, the nitrogen gas ionized by a continuous electrical arc discharge from cathode to anode 30, ionizing the nitrogen and forming a plasma from which the ion beam is extracted and accelerated by grids 27 to kinetic energies much higher than that of the particles in vapor 8. The gun directs the molecular and atomic nitrogen ions at substrate 10 and film 12, where it performs several functions; initially, the nitrogen ions clean substrate 10 of impurities such as carbon, oxygen, and hydrogen. As film 12 grows upon substrate 10, the ion beam of nitrogen similarly sputter cleans film 12 of similar impurities. More importantly, however, the high kinetic energy in the ion beam causes nitrogen particles to embed and bond with the silicon in film 12, forming an amorphous mixture of silicon nitride. Faraday cups 14, which are electron-suppressed charge collectors, are disposed adjacent to target 10, 12 so that Faraday cups 14 are exposed to the same nitrogen flux as is target sample 10, 12. Shield 16 protects silicon sample 18 from the high energy ions of ion gun 26. Experience shows that were crystal 18 not shielded in this manner, the high energy of the nitrogen ions would cause vibrations in crystal 18 that would make measurement of crystal 18's response to oscillator 22 impossible.

From the current collected by cups 14, once the apparatus is properly calibrated, one can infer the magnitude of nitrogen deposition in film 12. With this method, one can produce on a room temperature substrate, an amorphous film 12, having a stoichiometry which is a function of the magnitude of ion flux generated by ion gun 26 and the magnitude of silicon deposition in film 12.

Figure 2:
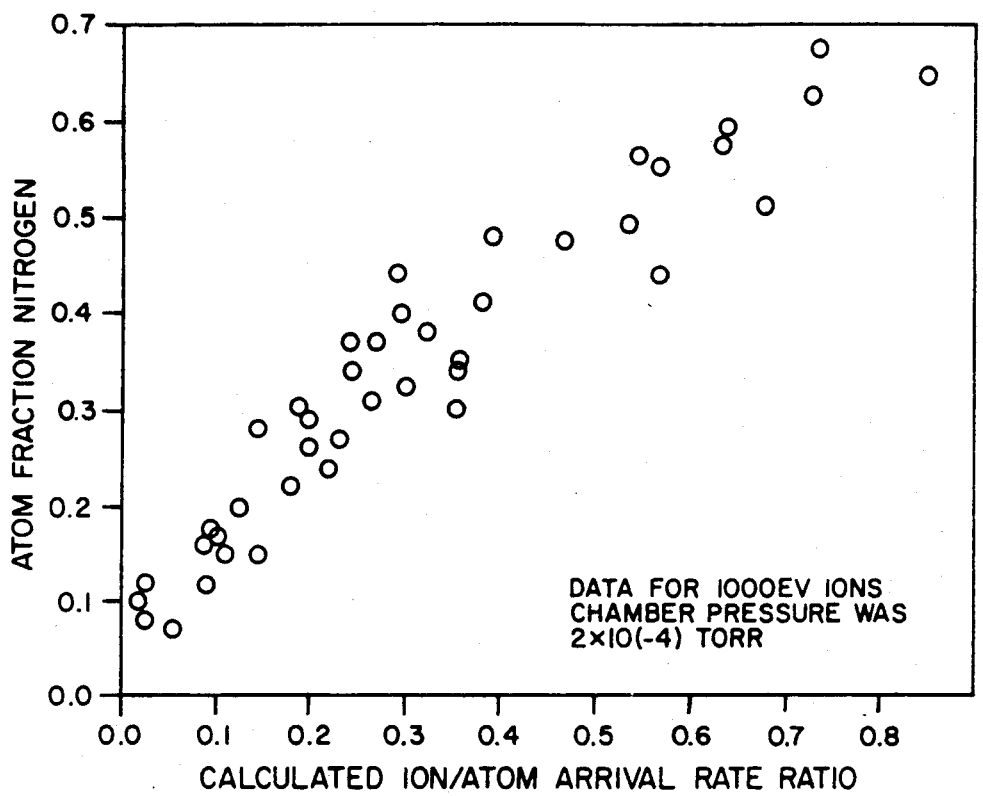
FIGS. 2 and 3 are graphs showing empirical data taken using an actual system of the kind shown in FIG. 1. In particular.

With particular reference to FIG. 2, a graph of calibration data is shown that was taken by an actual apparatus of the kind shown FIG. 1. The graph shows the relationship between the amount of nitrogen deposited in a film 12 and the relative amounts of nitrogen and silicon arriving at film 12, the relative amounts of nitrogen and silicon being inferred by Faraday cups 14, and silicon crystal 18.

Figure 3:
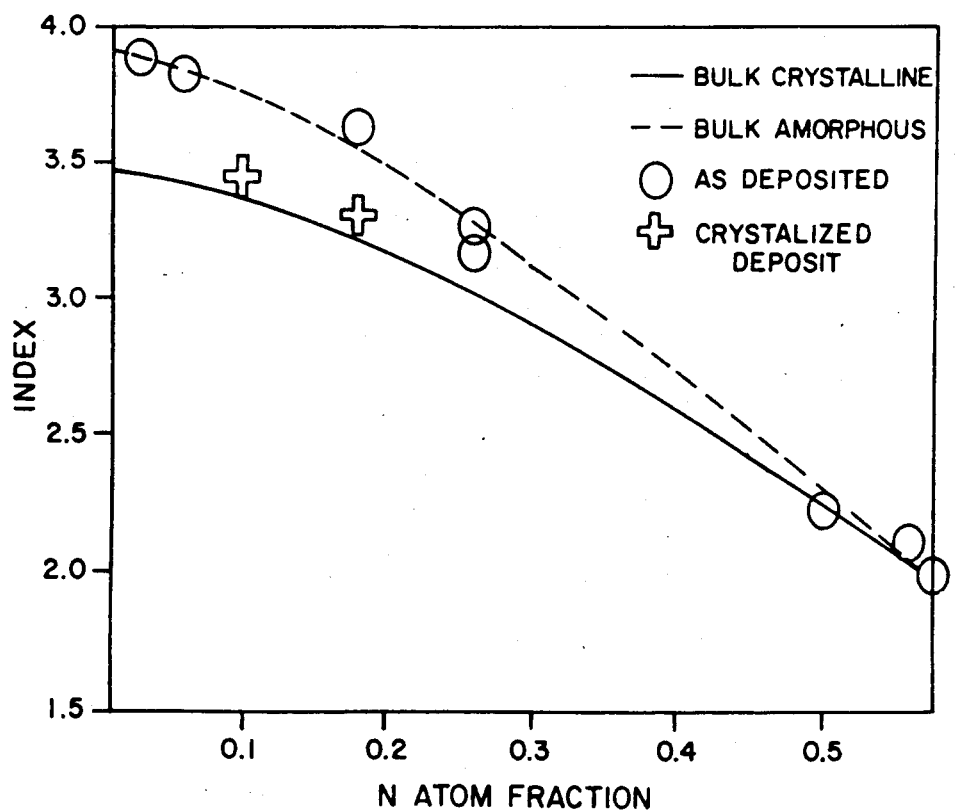

FIG. 3 shows data taken by the same apparatus, and is a graph of the measured relationship between the refractive indices of a plurality of films 12, and fraction of nitrogen in the films. Data points entered as circles are for amorphous films as deposited. Data points entered as crosses are for crystalline films generated by annealing amorphous films. The dotted and solid lines correspond to theoretically predicted values for amorphous and crystalline films respectively.

As is plain from FIGS. 2 and 3, these data can be used to calibrate an apparatus such as that shown in FIG. 1 so that, once calibrated, the apparatus can reproducibly generate films 12 of silicon nitride of the same stoichiometry. Similarly, during growth of film 12, one can use crystal 18 to monitor the rate of silicon deposition in film 12, and vary the ion flux from ion gun 26 (inferred from Faraday cups 14) during film growth in response to the deposition rate of silicon in film 12. In this manner, one can preselectedly vary the stoichiometry of film 12 as a function of time and therefore film depth, and hence its index of refraction. This control is best exercised by a dedicated process computer, as discussed more fully below.

Typical operating parameters for the apparatus shown in FIG. 1 are as follows:
Ion current: 5–450 microamperes/cm$^2$
Ion energy: 200–1500eV
$N_2$ pressure: $10^{-4}$ Torr
Silicon depositon: 2.5 to 20 Angstroms/sec
Substrate temperature: 25–400° C.

This is a relatively low vacuum compared to many other film growing processes, such as are used in semiconductor fabrication, and is made possible by the energetic ion flux, which continually sputter cleans the film and eliminates voids. These impurities could otherwise be excluded from the film and the film densified in this manner, only by exceptionally high vacuums and substrate temperatures. These values are merely exemplary, and in fact the apparatus may be operated effectively with very large variations in these values.

Using the apparatus with which the data of FIGS. 2 and 3 were taken, films as large as 2.8 micrometers in thickness have been produced.

Figure 4:
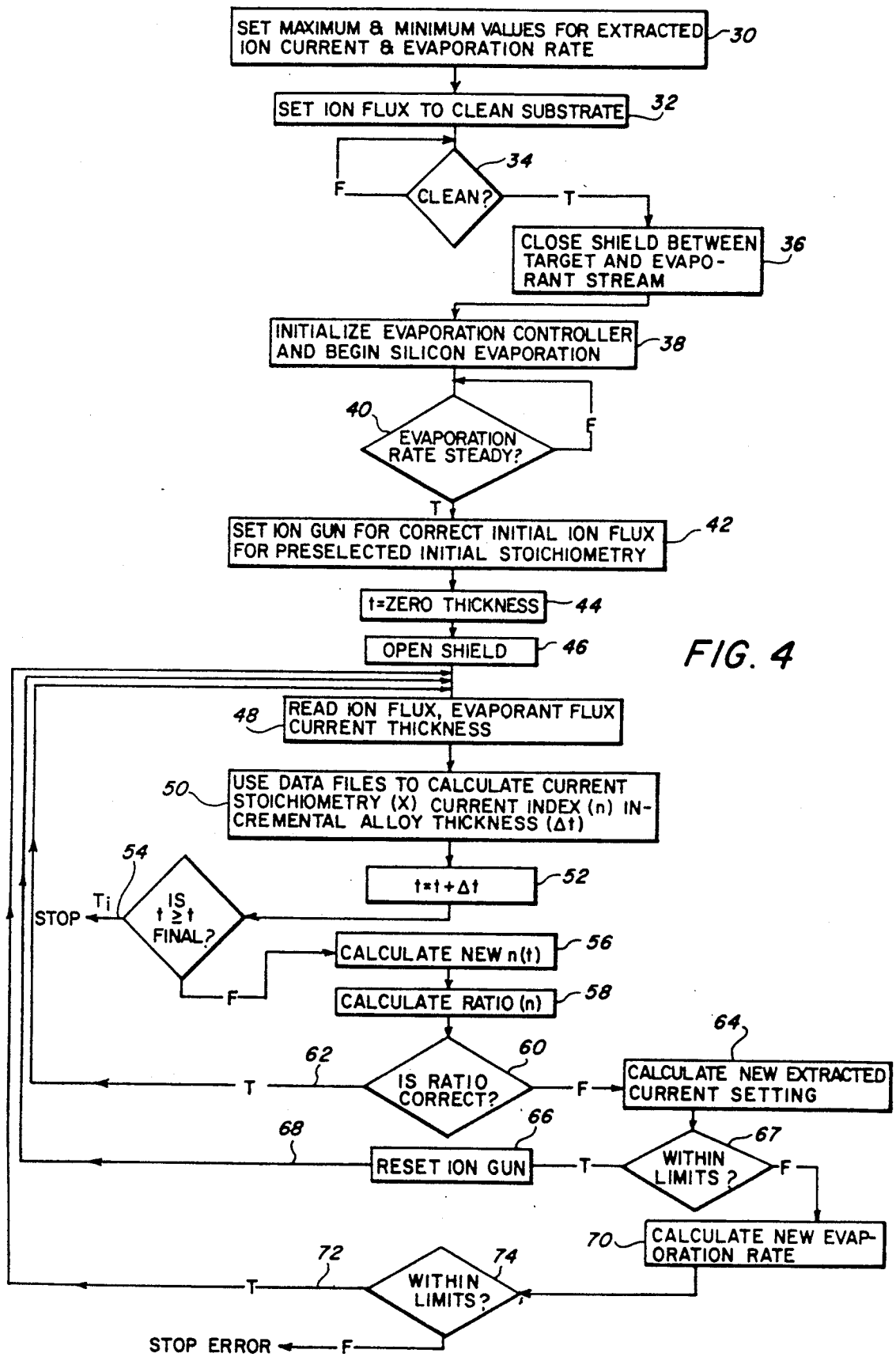
FIG. 4 is a flow diagram of a computer program for controlling the apparatus, and executing the method, of the instant invention.

With particular reference to FIGS. 4 and 1, FIG. 4 shows a flow diagram of a program for a dedicated process computer to control the apparatus of FIG. 1. The flow diagram of FIG. 4 is that of a program actually used in generating the data of FIGS. 2 and 3. Initially, the maximum permissible and minimum ion flow rate and silicon evaperation rate are input into the computer (indicated by numeral 30 in FIG. 4). The computer then commands (32) ion gun 26 to direct a magnitude of flux to substrate 10 of a magnitude preset in computer memory to effectively clean the surface of substrate 10 of impurities, this cleaning continuing for a preset time (34). The computer then commands (36) that a shutter or shield (not shown) move between substrate 10 and silicon block 6 to isolate substrate 10 from the vapor 8 evaporated from block 6. The computer then sets the initial silicon evaporation rate, and commands that electron gun 2 begin silicon evaporation (38). The computer monitors silicon deposition monitor 18 to determine when deposition reaches steady state (40). The computer then commands ion gun 26 to change the magnitude of its ion flux to correspond to that which is necessary for the initally desired stoichiometry (42). The computer does this based on calibration data (e.g that of FIGS. 2 and 3) in its memory, and selects stoichiometry to correspond to a preselected initial index n of refraction. The counter variable "t", indicating film thickness, is set to zero (44), and the computer commands (46) that the shield (not shown) separating silicon vapor 8 and substrate 10 be removed (46), and that deposition of film 12 should begin.

During deposition, the computer uses Faraday cups 14 and deposition monitor 18 (48) to calculate stoichiometry X and its corresponding refractive index n, and amount (delta t) of deposition of film 12 (50). After deposition of an inferred incremental thickness delta t of film 12, total film thickness t is updated in computer memory (52), and the process stopped should the film be fully deposited (54), or, if not fully deposited, a new index n of refraction calculated (56). By calculating a new index n, it is meant that the computer determines the desired index of the next portion delta t of film 12. If, for example, one were forming a film 12 with index n varying sinusoidally with thickness t, the computer would update n as n = $n_O$ + A Sin (t + delta t), A being a preprogrammed proportionality constant. The computer then uses updated n and its calibration data base to calculate the flux ratio of silicon to nitrogen necessary to generate index n (58), and uses monitors 14 and 18 to determine whether the current flux ratio is correct for this n (60). If so, the computer repeats its routine for growing an incremental thickness delta t (62). If not (as is the case in the above example), the computer uses its calibrational data base to calculate the new ion current necessary to produce the stoichiometry corresponding to its updated value of n (64). If the current is within limits (set by step 30), the computer appropriately changes the magnitude of ion current (66), and repeats its routine for growing another incremental thickness (68). If the new ion current cannot be set within limits, the computer determines this (67) and calculates the new silicon evaporation rate necessary to reproduce the correct stoichiometry (70), and repeats the routine for growing another incremental thickness (72), unless this would require a silicon evaporation rate exceeding the limits set in step 30, (74), in which case no further growing of film 12 is possible, and the computer shuts the process down.

Obviously, numerous additional variations and modifications of the present invention are possible in light of the above teachings. It is therefore to be understood that within the scope of the appended claims, the invention may be practiced otherwise than as specifically described herein.

What is claimed and desired to be secured by Letters Patent of the United States is:

1. A method for producing substoichiometric silicon nitride $Si_{1-x}N_x$ of preselected stoichiometry x, said method employing an apparatus comprising: a means for depositing a film of silicon on a substrate; and a means for delivering nitrogen to said film; said method comprising:
  a step for depositing said silicon film on said substrate;
  a step for causing said means for delivering said nitrogen to deliver nitrogen to said substrate simultaneously with said depositing of said film, effective to cause mixing of said nitrogen and said silicon in said film, said mixing being effective to make said film a substoichiometric silicon nitride alloy $Si_{1-x}N_x$;
  a step for controlling the amounts of said nitrogen delivered and said silicon deposited, effective to preselectively determine said stoichiometry x of said substoichiometric silicon nitride $Si_{1-x}N_x$; and
  a step for altering by a preselected amount said relative amounts of said nitrogen delivered, and said silicon deposited, responsive to a silicon monitoring means and a nitrogen monitoring means, said step for altering being effective to alter said stoichiometry x by a preselected amount uniquely corresponding to said altering of said relative amounts of said nitrogen delivered and said silicon deposited.

2. The method of claim 1, wherein said apparatus comprises a silicon monitoring means for monitoring the magnitude of said depositing of said film, and a nitrogen monitoring means for monitoring the magnitude of said delivering of said nitrogen.

3. The method of claim 2, wherein said step for altering is a plurality of said steps for altering, said plurality of steps being effective to cause said stoichiometry of said film to vary in a preselected manner as a function of the deposition thickness of said film.

4. The method of claim 3, wherein said means for delivering nitrogen is an ion gun effective to bombard said film a said beam of ions, the ions of said beam having a magnitude of kinetic energy greater than the interatomic bond energy between silicon and at least one of the atoms of the group consisting of: carbon, hydrogen and oxygen; and wherein said magnitude of kinetic energy is effective to cause said step for causing said means for delivering said nitrogen to be effective to sputter clean said film of at least one member of said group, whereby said beam of ions is effective to sputter clean said film.

5. The method of claim 4, wherein, said, magnitude of said energy of said ions in said beam of ions is effective to cause said ions to adhere to said film by forming molecular bonds with said silicon in said film, said magnitude also being effective to densify voids on said film.

6. The method of claim 2, wherein said means for delivering nitrogen is an ion gun effective to bombard said film with a beam of ions, the ions of said beam having a magnitude of kinetic energy greater than the interatomic bond energy between silicon and at least one of the atoms of the group consisting of: carbon, hydrogen and oxygen; and wherein said magnitude of said kinetic energy is effective to cause said step for causing said means for delivering said nitrogen to be effective to sputter clean said film of at least one of said group, whereby said beam of ions is effective to sputter clean said film.

7. The method of claim 1, wherein said means for delivering nitrogen is an ion gun effective to bombard said film with a beam of ions, the ions of said beam having a magnitude of kinetic energy greater than the interatomic bond energy between silicon and at least one of the atoms of the group consisting of: carbon, hydrogen and oxygen; and wherein the magnitude of said kinetic energy is effective to cause said step for causing said means for delivering said nitrogen to be effective to sputter clean said film of at least one of said group, whereby said beam of ions is effective to sputter clean said film.

8. The method of claim 2, wherein:
said apparatus further comprises control means for controlling said stoichiometry x as a function of the thickness of said film, said control means comprising:
means for sensing said magnitude of said depositing of said film;
means, responsive to said thickness sensed by said means for sensing, for varying said magnitude of said delivering of said nitrogen by an amount preselected to cause said stoichiometry x to be a preselected value as a function of said thickness.

9. The method claim 8, wherein said means for varying said magnitude of said delivering of nitrogen is effective, responsive to said magnitude of said depositing of said film sensed by said means for sensing, to cause said stoichiometry x to vary continuously as a function of said thickness.

10. The method of claim 9, wherein:
said means for varying comprises a faraday cup means for measuring said magnitude of said delivering of said nitrogen; and
said silicon monitoring means comprises a crystal oscillator exposed to said silicon, said oscillator having a characteristic frequency, said frequency varying as a function of the mass of silicon deposited on said oscillator by said means for depositing.

11. A method of producing stoichiometric silicon nitride $Si_{1-x}N_x$ of preselected stoichiometry x, said method comprising:
evaporating a gas of silicon;
directing said gas of silicon onto a substrate effective to cause said gas of silicon to deposit a film on said substrate;
simultaneously with said directing of said silicon gas, directing a nitrogen ion beam onto said substrate effective to mix nitrogen from said ion beam with said film as said film deposits on said substrate;
monitoring the depth of deposition of said film;
measuring the rate of delivery of nitrogen to said film by said ion beam;
responsive to said monitoring of said depth of deposition, and responsive to said rate of delivery, varying the relative rate at which said silicon gas and said nitrogen are delivered to said film effective to permit said x to preselectedly vary as a function of said depth;
wherein said varying is done continuously over a preselected period of time effective to continuously and preselectedly vary said x as a function of said depth.

12. The method of claim 11, wherein the energy of the ions in said ion beam are selected to permit said producing of said $Si_{1-x}N_x$ at about room temperature.

13. The method of claim 12, wherein said energy of said ions in said ion beam is between about 200 and 1500 eV.

* * * * *